(12) United States Patent
Chang (10) Patent No.: US 7,224,178 B2
(45) Date of Patent: May 29, 2007

(54) CIRCUIT RE-SYNTHESIS AND METHOD FOR DELAY VARIATION TOLERANCE

(75) Inventor: Shih-Chieh Chang, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 110 days.

(21) Appl. No.: 11/014,170

(22) Filed: Dec. 17, 2004

(65) Prior Publication Data

US 2006/0132169 A1    Jun. 22, 2006

(51) Int. Cl.
*H03K 19/003* (2006.01)
(52) U.S. Cl. .................... 326/11; 326/8; 326/9; 326/14

(58) Field of Classification Search ............... 326/9–15
See application file for complete search history.

(56) References Cited

U.S. PATENT DOCUMENTS 4,839,855 A * 6/1989 Van Driel .................... 713/503
2004/0230935 A1* 11/2004 Samudrala et al. ........... 716/17

* cited by examiner

*Primary Examiner*—Anh Q. Tran
(74) *Attorney, Agent, or Firm*—Troxell Law Office, PLLC (57) ABSTRACT

By adding redundant logic gates into a circuit without changing function of the whole circuit, the present invention can tolerate certain delay variations. The present invention can be applied in the IC industries to improve the yield in semiconductor manufacturing.

10 Claims, 12 Drawing Sheets

CIRCUIT RE-SYNTHESIS AND METHOD FOR DELAY VARIATION TOLERANCE

FIELD OF THE INVENTION

The present invention relates to providing a circuit re-synthesis; more particularly, relates to providing a novel technique to re-synthesize a circuit so that the circuit can tolerate the delay variation problem so as to be applied to IC-related industries.

DESCRIPTION OF THE RELATED ARTS

Due to the design trend on the shrinkage of device geometry, lower power voltage, and higher frequency, circuit performance is increasingly sensitive to factors such as process variations, noises, and delay defects. These factors can negatively affect the timing behavior of a circuit and, therefore, can cause delay variation in a chip. The delay variation problem may cause several disadvantages such as timing yield loss. To alleviate delay variation problems, according to prior arts, designers often have to adopt a worst-case delay model or employ a timing margin to protect the performance from delay variation. In practice, conservative assumptions are used from delay modeling to delay calculation. However, such a conservatism is becoming an unnecessary pessimism. In prior arts, it is reported that a fabricated Application Specific Integrated Circuit (ASIC) may run up to 40% faster than predicted by the standard (worst-case) timing analysis. On the other hand, even if we can afford the over-design penalty, determining an appropriate worst corner is still difficult due to multiple sources of delay variation and their complex influence on circuit performance. Moreover, adding timing margin may not be possible for a timing critical design. Hence, the prior arts can not fulfill all the requirements of the user on actual applications.

SUMMARY OF THE INVENTION

Therefore, in the present invention, instead of sacrificing the performance, a novel way is proposed to trade area for delay variation tolerance.

In a circuit, some gates (wires) are vulnerable to delay variation. The vulnerability can be best characterized by a gate's slack, the quantity that represents the affordable margin without violating the circuit's delay. The larger the slack of a gate is, the less vulnerable the gate will be. Therefore, the main purpose of the present invention is to re-synthesize a circuit so that the slacks of all vulnerable gates are increased.

The present invention contains two re-synthesis methods, one of which is applicable to static circuits and the other is applicable to domino circuits. For a static circuit, two additional redundant circuits are generated and then connected to a majority voting machine together with the original circuit. On the other hand, for a domino circuit, one additional redundant circuit is generated and then connected to an OR gate together with the original domino circuit.

Accordingly, a certain degree of tolerance toward the circuit's performance variations can be obtained in the circuit. The present invention can be applied in the IC industries to improve the yield in semiconductor manufacturing.

BRIEF DESCRIPTIONS OF THE DRAWINGS

The present invention will be better understood from the following detailed descriptions of the preferred embodiments according to the present invention, taken in conjunction with the accompanying drawings, in which.

DESCRIPTION OF THE PREFERRED EMBODIMENTS

The following descriptions of the preferred embodiments are used to demonstrate the features of the present invention.

Figure 1:
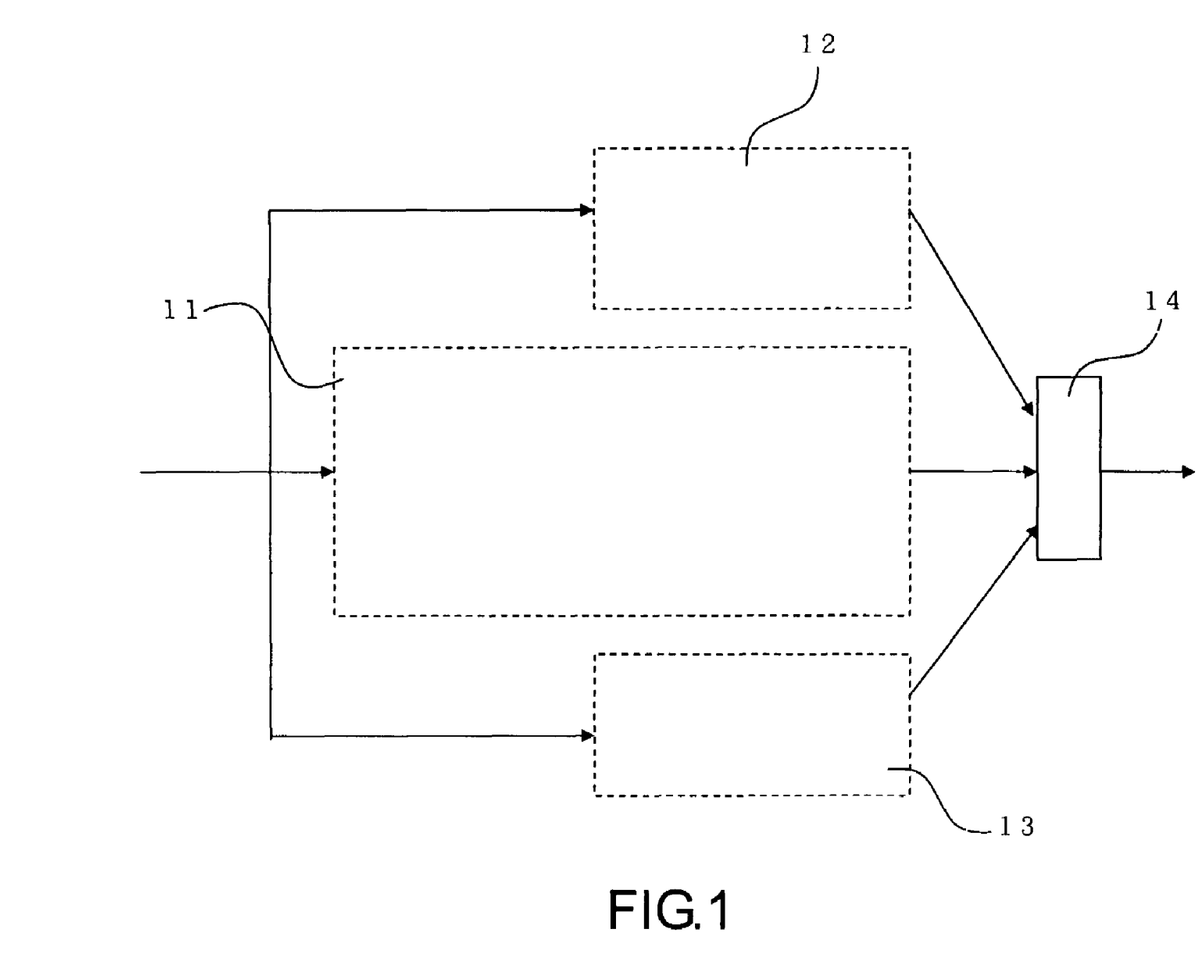
FIG. 1 is a view showing the delay tolerance structure for a static circuit according to the first preferred embodiment of the present invention.

FIG. 1 shows the first preferred embodiment about the delay tolerance structure for static circuits. The structure comprises an original static circuit 11, a first redundant circuit 12, and a second redundant circuit 13, where the three circuits are all connected to a voting machine 14 in a parallel way. The ability of delay variation tolerance results from the usage of voting machines. For a voting machine with three inputs, the result of the voting machine is determined as long as any two inputs of the voting machine receive the correct results. In FIG. 1, when any two of circuits 11, 12, and 13 generate the results, the voting machine produces the results. Therefore, if any one of circuits 11, 12, and 13 suffers delay increment, the voting machine can still produce correct results on time.

In the above static circuit, the original circuit 11, the first redundant circuit 12, and the second redundant circuit 13 are each an assembled logic circuit, which can be a basic logic gate of an AND gate, an OR gate, or a NOT gate. Therein, the basic logic gate can be further connected with a resistor, a capacitor or an inductor to form a matching circuit.

Figure 2:
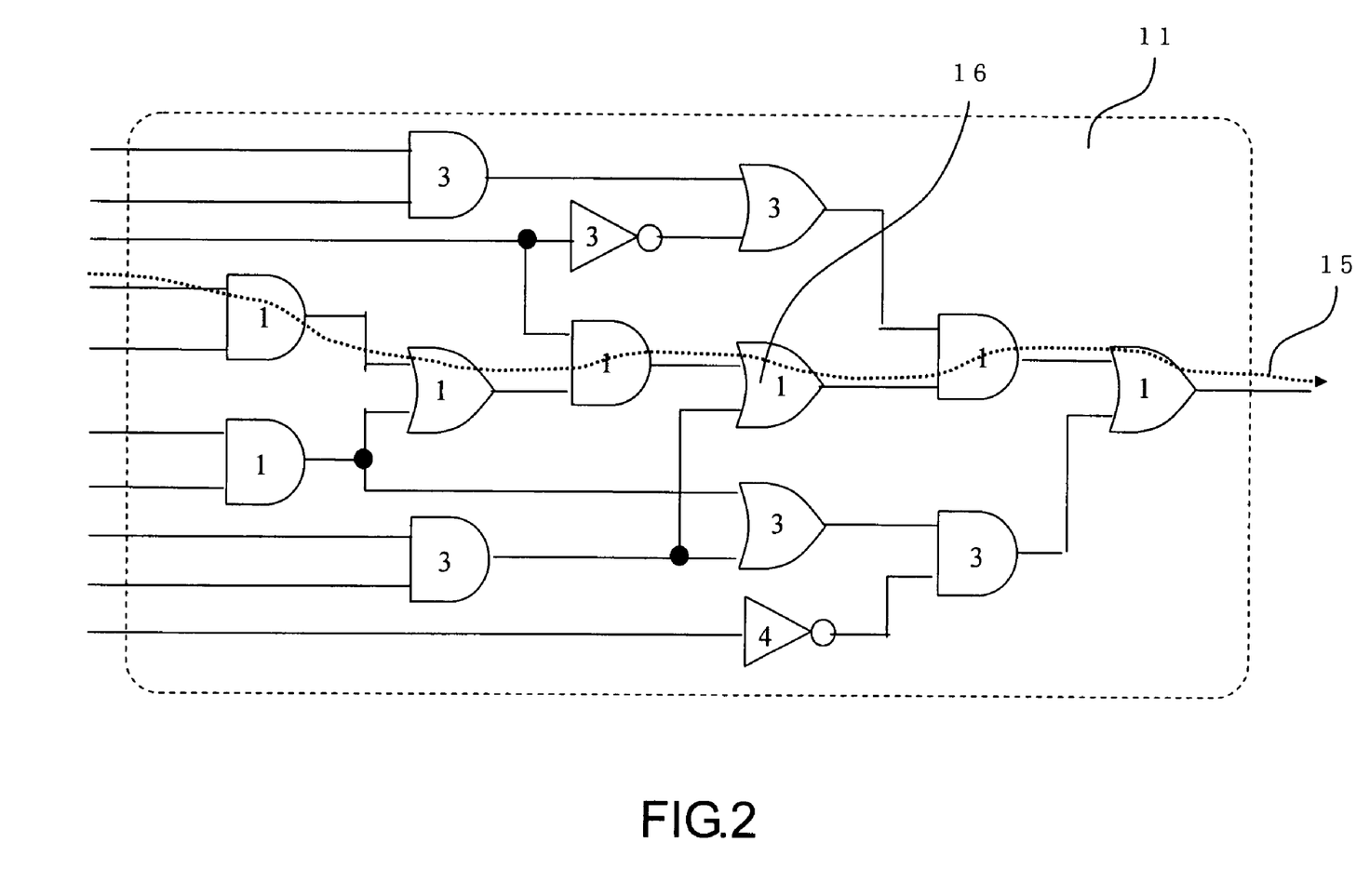
FIG. 2 is a view showing a static circuit.
Figure 3:
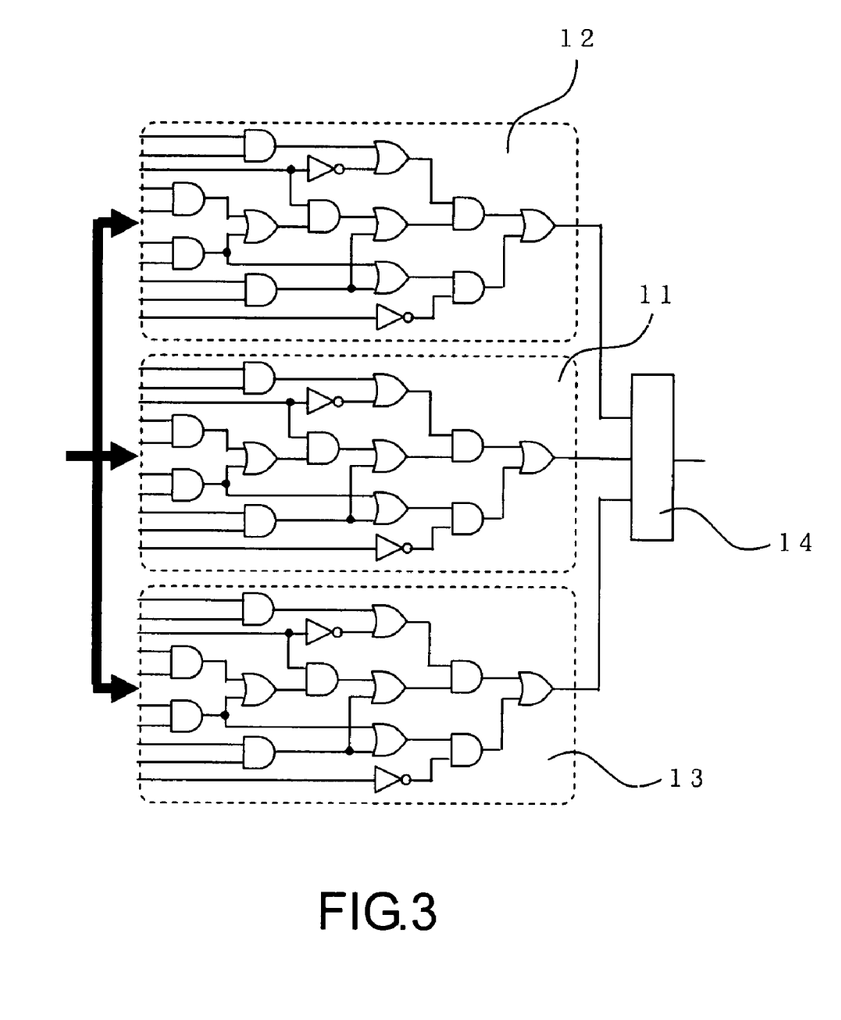
FIG. 3 through FIG. 6 are views showing the steps of constructing the delay tolerance structure for the static circuit in FIG. 2 according to the first preferred embodiment of the present invention.
Figure 4:
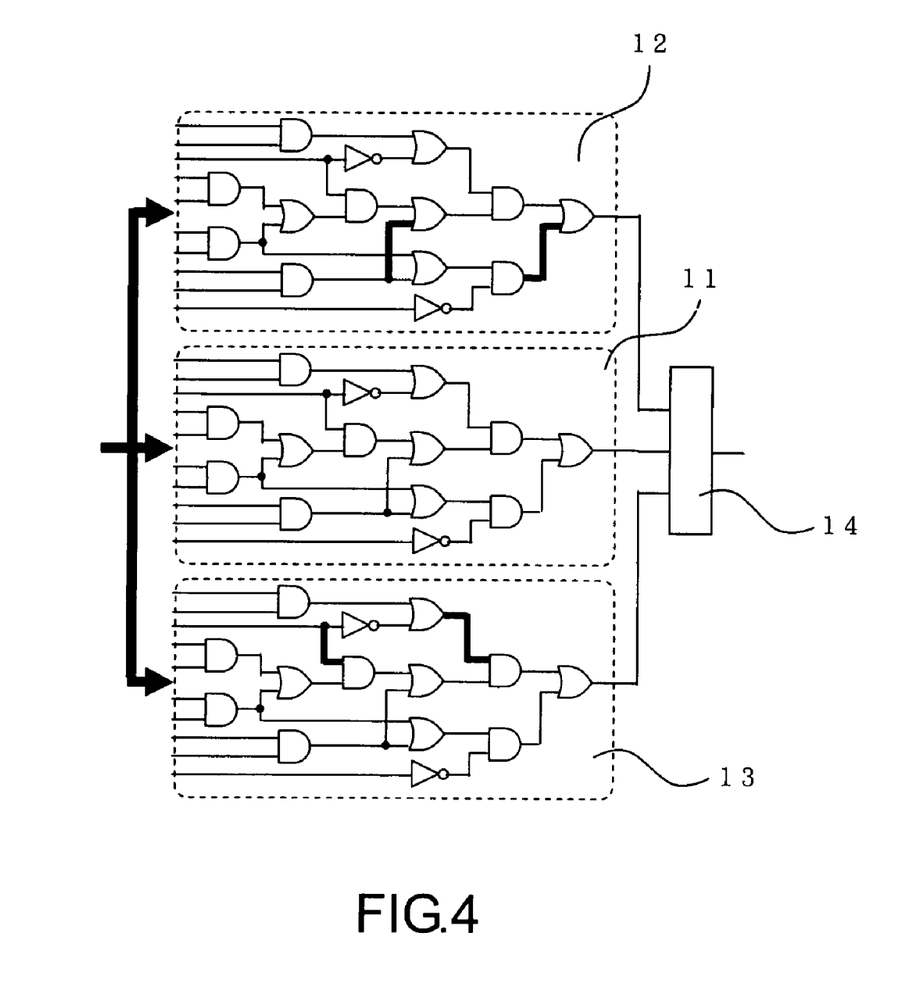
Figure 5:
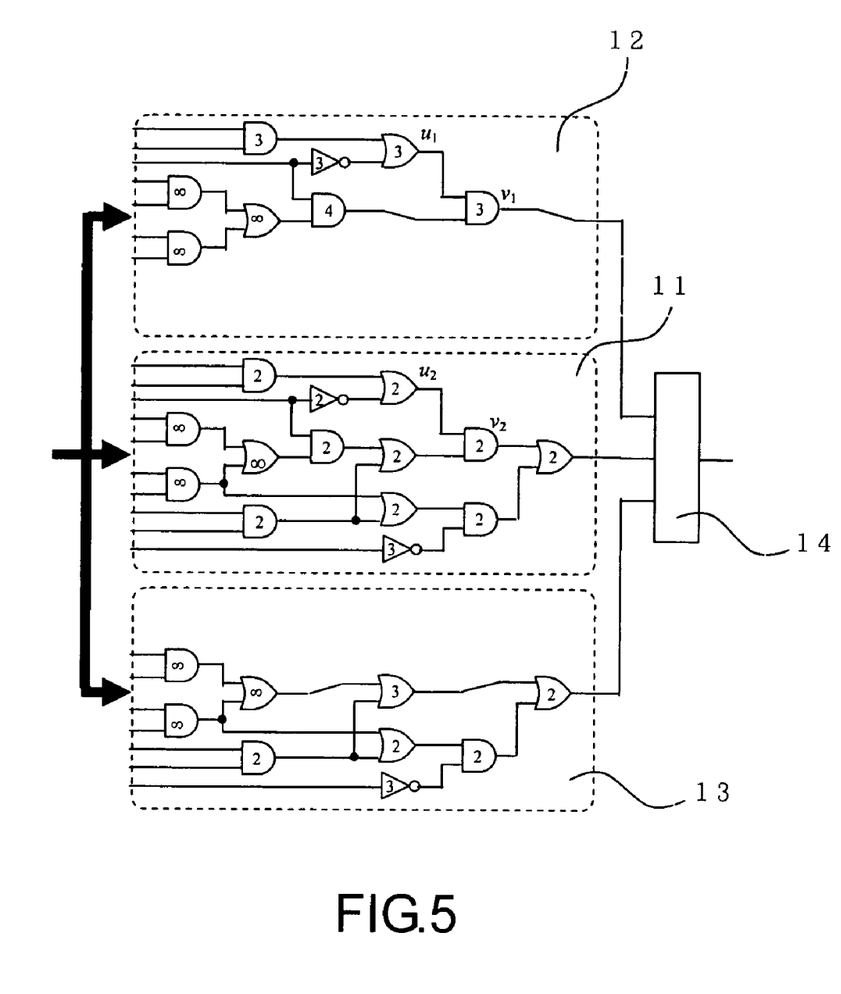
Figure 6:
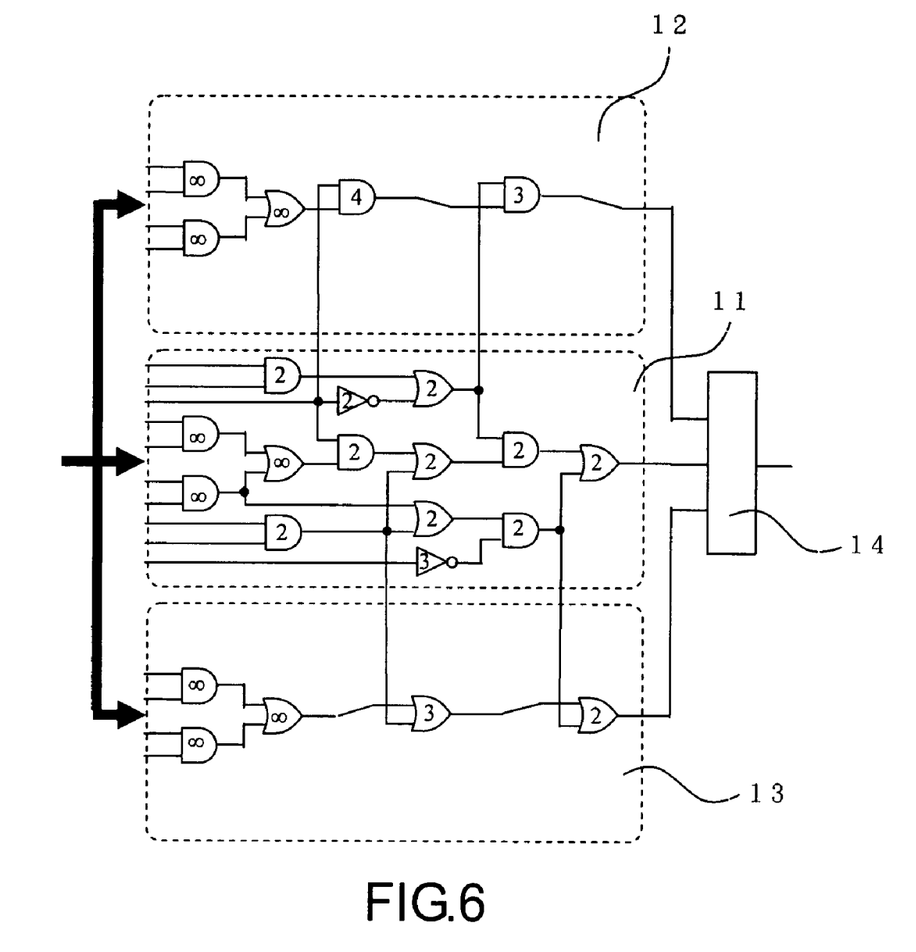

We use the static circuit in FIG. 2 as an example to demonstrate the construction of the delay tolerance structure. In the circuit, assume a gate's delay is 1 and the timing requirement is 7. Accordingly, one can calculate each gate's slack as shown by the number inside each gate. In the circuit, the most vulnerable gates have the smallest slack of 1. We intend to increase the smallest slack to 2 by the method of the first preferred embodiment. Please refer to FIG. 3 through FIG. 6, which are views showing the steps of constructing the delay tolerance circuit. Note that the construction of a delay tolerance structure involves the generation of the first redundant circuit and the second redundant circuit. Hence, we will introduce as follows how to produce them. In FIG. 3, we duplicate the original circuit 11 to generate the first redundant circuit 12 and the second redundant circuit 13. By calculating the slacks in the circuit in FIG. 3, one can find the smallest slack is increased to infinite, which obviously satisfies the pre-determined goal of 2. However, the area penalty is also large, about two times the area of the original circuit. In the following steps, we demonstrate the reduction of the area penalty. Since some wires in circuits 11, 12, and 13 are redundant, removing those wires will not alter the functionality of the whole circuit. Moreover, among those redundant wires, some wires (such as the bold lines in FIG. 4) have the property that, when they are removed, the smallest slack in the circuit can still be maintained at least the goal of 2. After removing such wires (for example, the bold lines in FIG. 4), the resulting circuit is shown in FIG. 5. Note that the smallest slack can still satisfy the pre-determined goal but the area penalty has been significantly reduced. In addition to wire removal, some wires can be rerouted without decreasing the smallest slacks. For example in FIG. 5, the wire connecting gates $u_1$ and $v$, can be rerouted from $u_2$ to $v_1$. FIG. 6 shows the resulting circuit after rerouting all such wires. Note that the smallest slack still satisfies the goal of 2. Therefore, the first preferred embodiment of the present invention can increase the delay variation tolerance of static circuits by costing a small area penalty.

Figure 7:
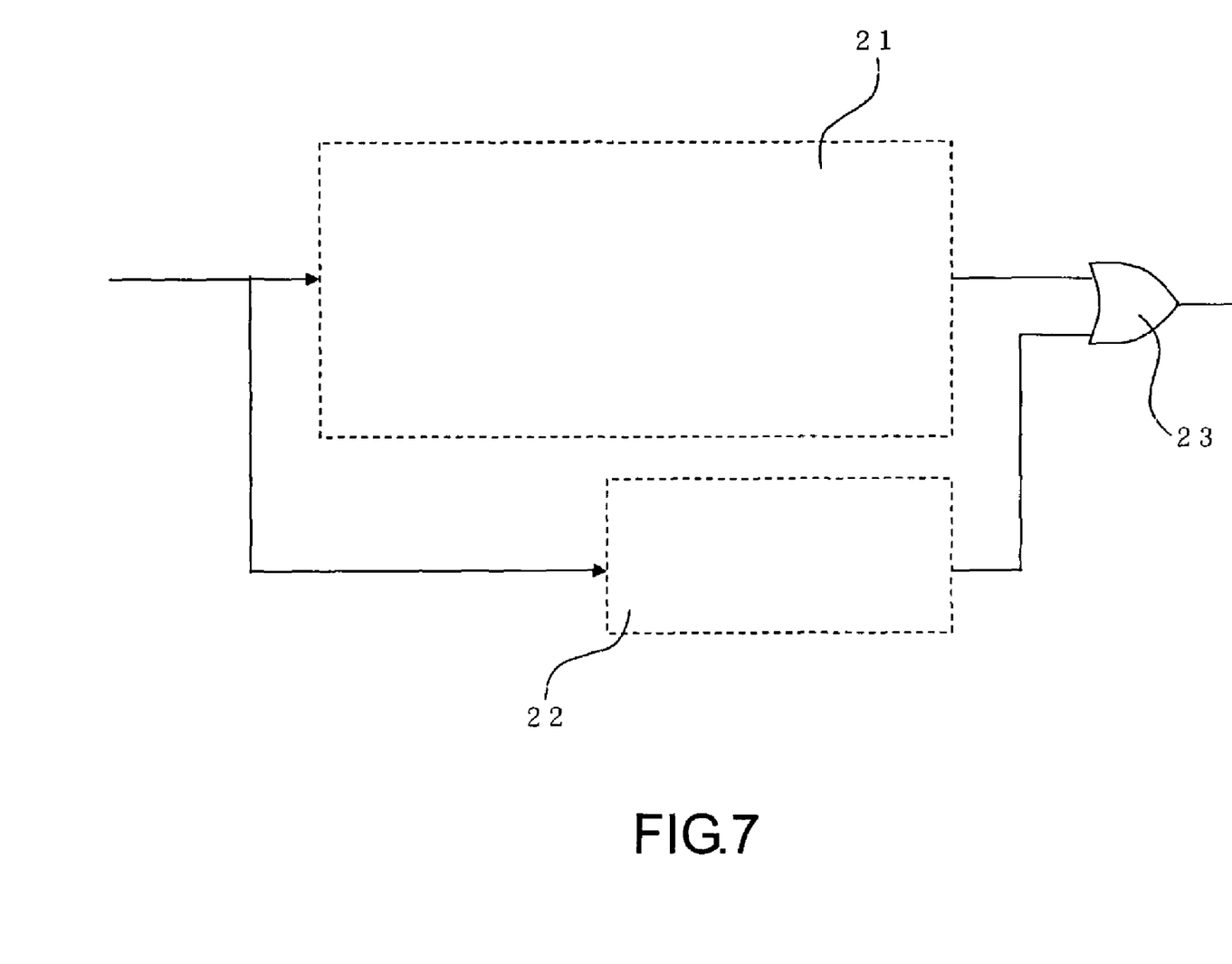
FIG. 7 is a view showing the delay tolerance structure for a dynamic domino circuit according to the second preferred embodiment of the present invention.

In another way, the present invention also provides a circuit re-synthesis for (dynamic) domino circuits. FIG. 7 shows the second preferred embodiment about the delay tolerance structure for domino circuits. The structure comprises an original domino circuit 21, a redundant circuit 22, and a logic gate 23. In the above domino circuit, the original circuit and the redundant circuit can each be an assembled logic circuit, which can be a basic logic gate of an AND gate, an OR gate, or a NOT gate. Also, the basic logic gate can be further connected with a resistor, a capacitor, or an inductor in a serial or a parallel way to form a matching circuit.

Figure 8:
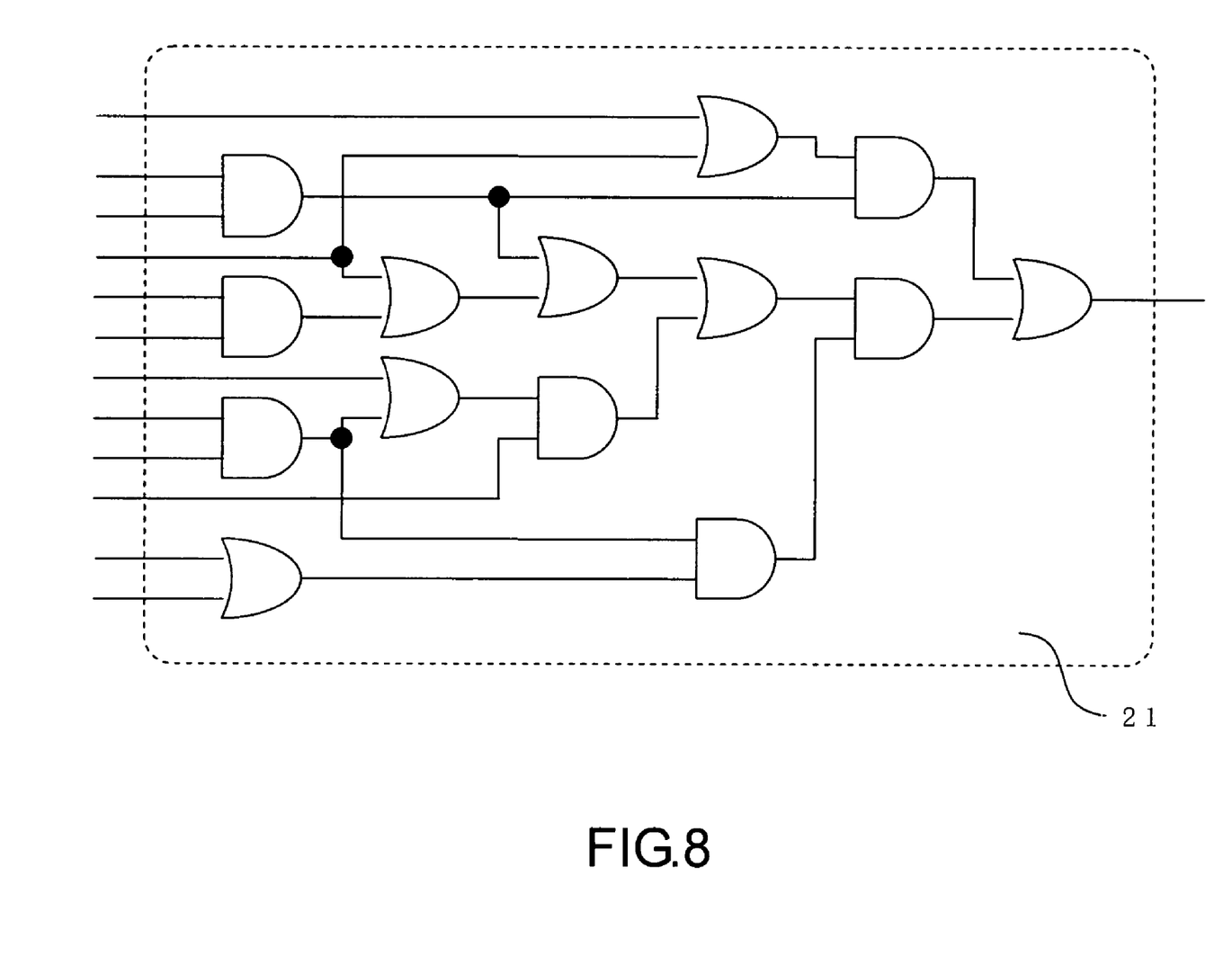
FIG. 8 is a view showing a dynamic circuit.
Figure 9:
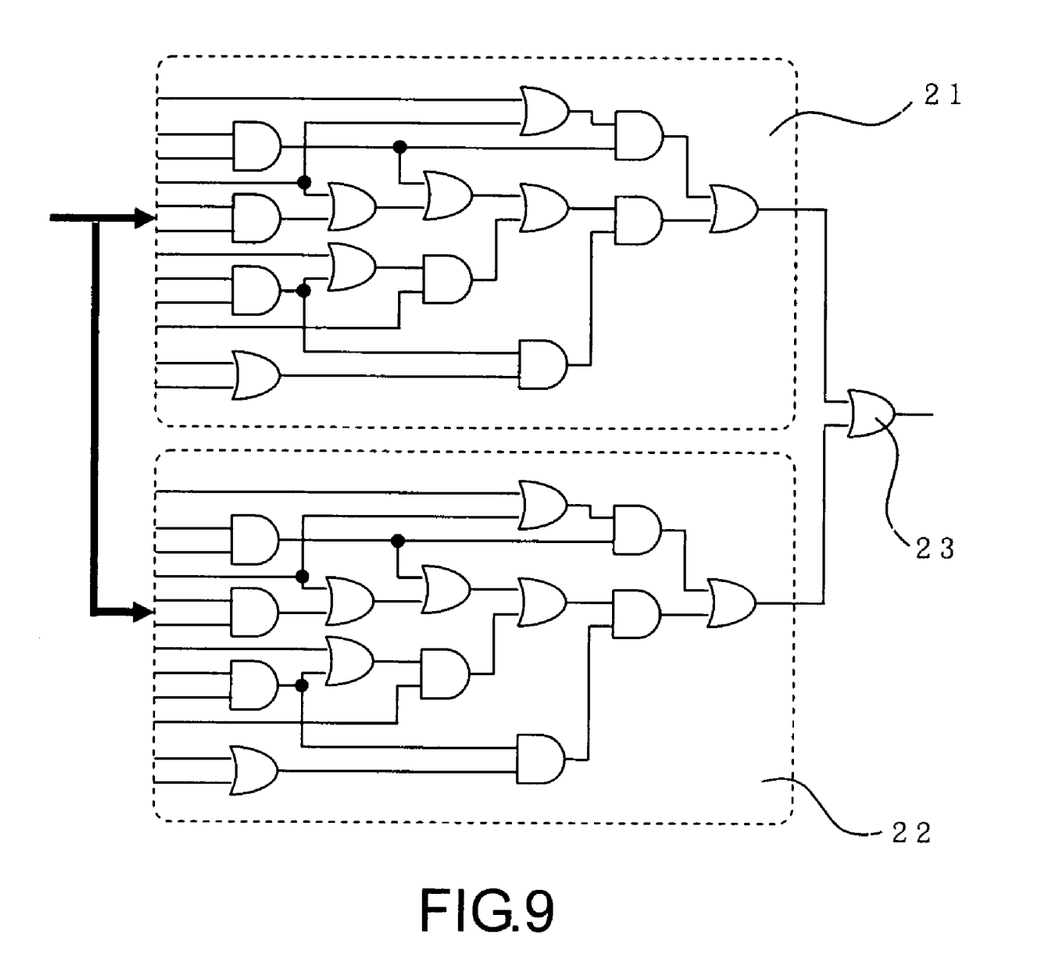
FIG. 9 through FIG. 12 are views showing the steps of constructing the delay tolerance structure for the domino circuit in FIG. 8 according to the second preferred embodiment of the present invention.
Figure 10:
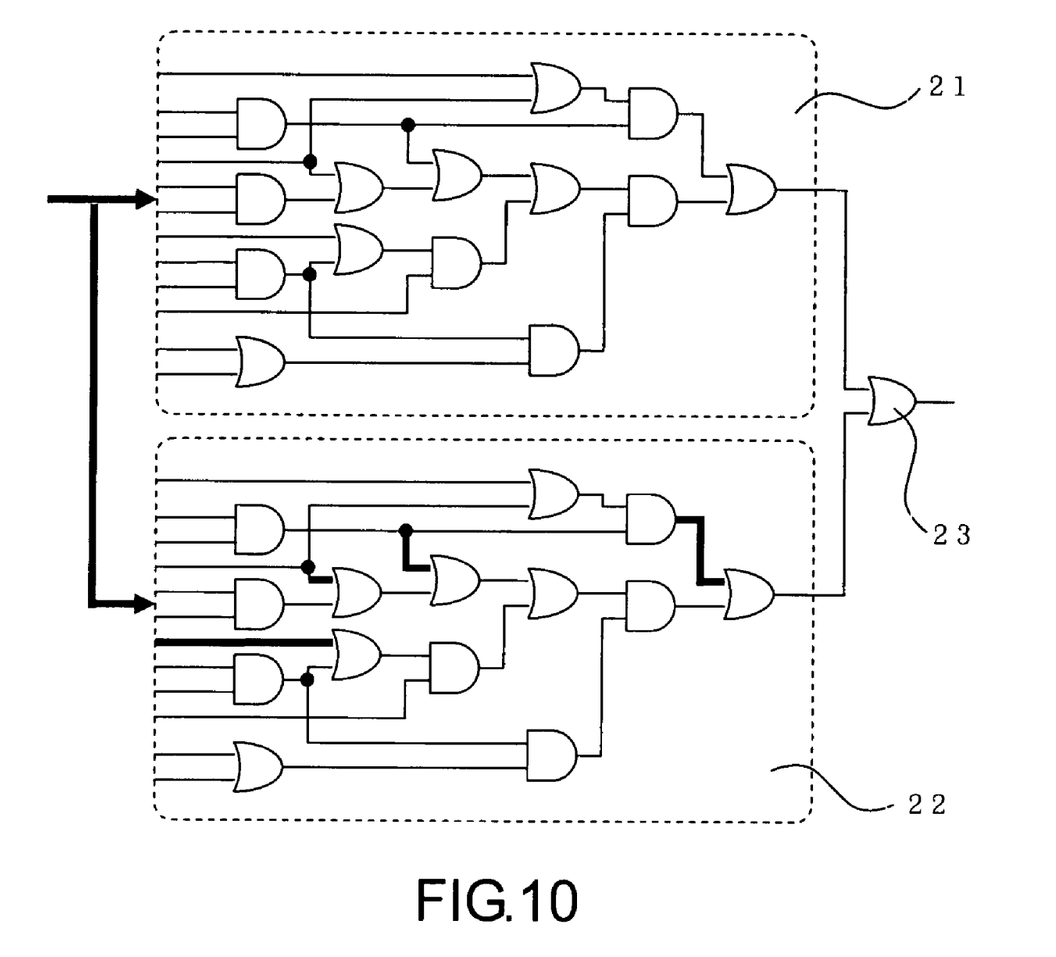
Figure 11:
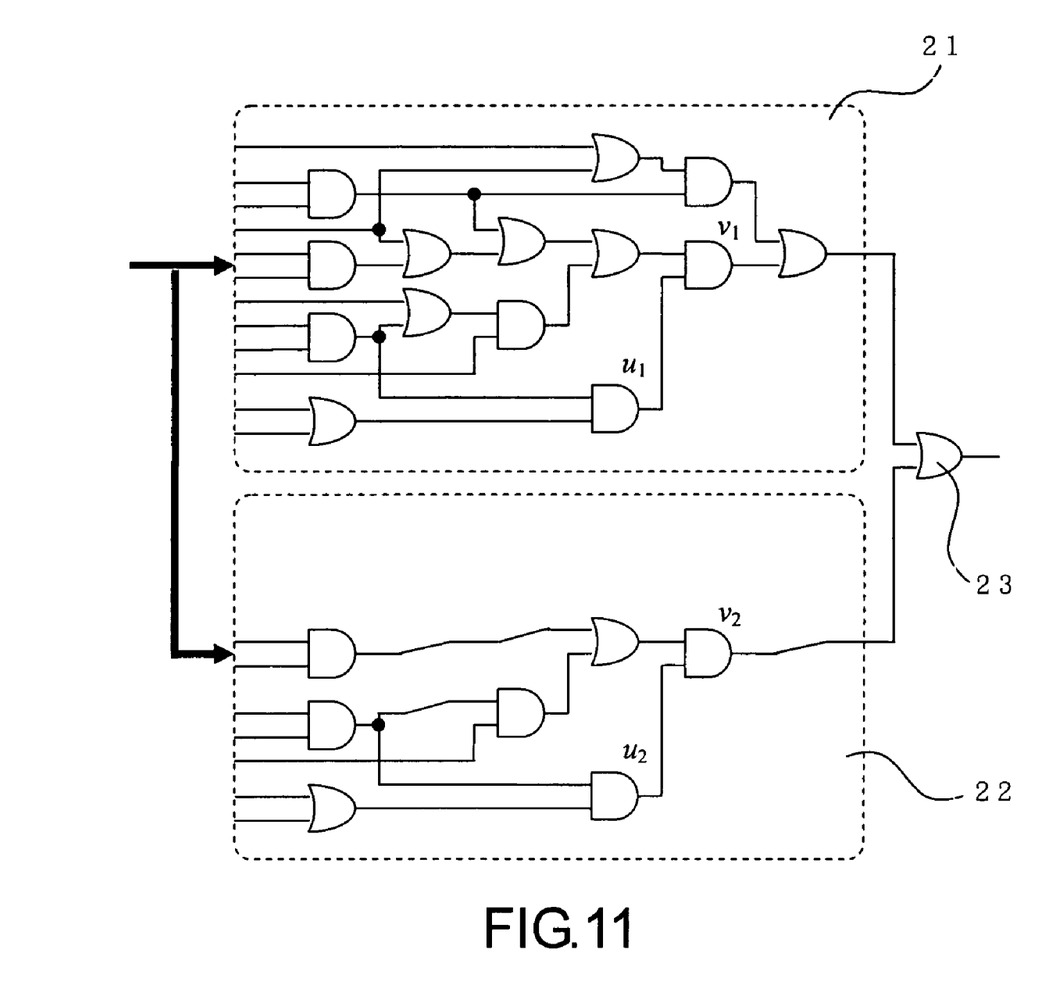
Figure 12:
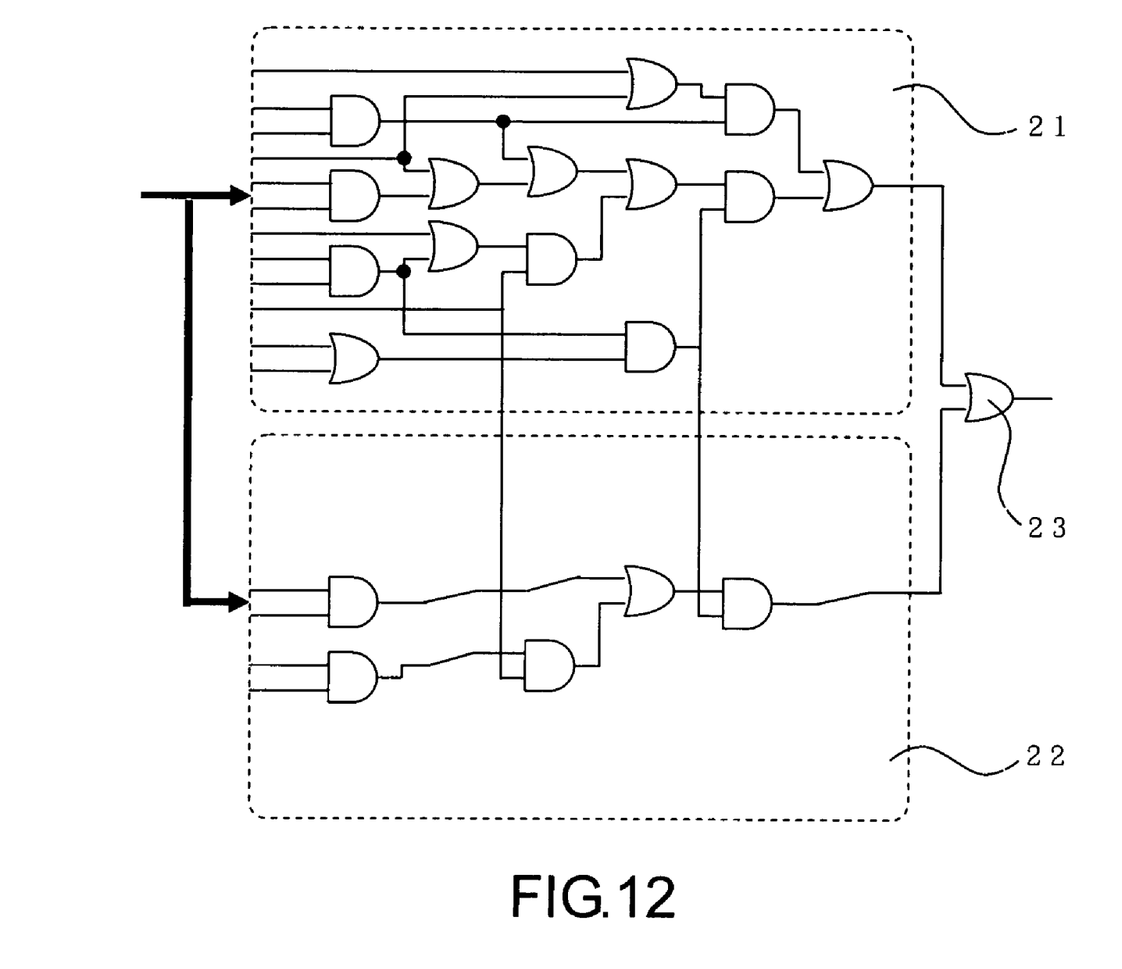

We use the domino circuit in FIG. 8 as an example to demonstrate the construction of the delay tolerance structure. Please refer to FIG. 9 through FIG. 12, which are views showing the steps of constructing delay tolerance domino circuits according to the second preferred embodiment of the present invention. Note that the construction of a delay tolerance structure involves the generation of the redundant circuit, so we will introduce as follows how to produce it. In FIG. 9, we duplicate the original domino circuit 21 to obtain the redundant circuit 22. Moreover, the outputs of circuits 21 and 22 are connected to the inputs of gate 23 (such as an OR gate). Just as what happens to the previous static circuit example, in the domino circuit, some wires (such as the bold lines in FIG. 10) are redundant and smallest-slack-maintaining, so we can remove them without altering the whole circuit's functionality and without violating the smallest slack goal. After removing such wires (for example, the bold wires in FIG. 10), the resulting circuit is shown in FIG. 11. In addition to wire removal, some wires can be rerouted without decreasing the smallest slack in the circuit. For example in FIG. 11, the wire connecting gates $u_2$ and $v_2$ can be rerouted from $u_1$ to $v_2$. FIG. 12 shows the resulting circuit after rerouting all such wires. Consequently, the second preferred embodiment of the present invention achieves the delay variation tolerance of domino circuits by costing a small area penalty.

To sum up, by utilizing a main strategy of adding redundancies, the present invention can effectively improve the tolerance of the circuit toward the unfavorable changes in operation speed, which are induced by process variation or noises.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A circuit structure for delay variation tolerance, comprising:
   a set of voting machines;
   an original circuit, wherein some outputs of said original circuit are connected to first inputs of said voting machines;
   a first redundant circuit, wherein some outputs of said first redundant circuit are connected to second inputs of said voting machines; and
   a second redundant circuit, wherein some outputs of said second redundant circuit are connected to third inputs of said voting machines wherein said voting machines are configured to compare the delay variations of said circuits and output timely results even when one of said circuits exhibits delay variation.

2. The circuit re-synthesis according to claim 1, wherein said original circuit is an assembled logic circuit.

3. The circuit re-synthesis according to claim 1, wherein said original circuit comprises at least one basic logic gate which is selected from a group consisting of an AND gate, an OR gate and a NOT gate.

4. The circuit re-synthesis according to claim 3, wherein said basic logic gate is connected with which is selected from a group consisting of a resistor, a capacitor and an inductor.

5. The circuit re-synthesis according to claim 1, wherein said first redundant circuit is an assembled logic circuit.

6. The circuit re-synthesis according to claim 1, wherein said first redundant circuit comprises at least one basic logic gate which is selected from a group consisting of an AND gate, an OR gate and a NOT gate.

7. The circuit re-synthesis according to claim 6, wherein said basic logic gate is connected with which is selected from a group consisting of a resistor, a capacitor and an inductor in a way which is selected from a group consisting of a serial way and a parallel way.

8. The circuit re-synthesis according to claim 1, wherein said second redundant circuit is an assembled logic circuit.

9. The circuit re-synthesis according to claim 1, wherein said second redundant circuit comprises at least one basic logic gate which is selected from a group consisting of an AND gate, an OR gate and a NOT gate.

10. The circuit re-synthesis according to claim 9, wherein said basic logic gate is connected with which is selected from a group consisting of a resistor, a capacitor and an inductor.

* * * * *